(12) United States Patent
Salzman et al.

(10) Patent No.: US 10,002,870 B2
(45) Date of Patent: Jun. 19, 2018

(54) PROCESS ENHANCEMENT USING DOUBLE SIDED EPITAXIAL ON SUBSTRATE

(71) Applicant: Texas Instruments Incorporated, Dallas, TX (US)

(72) Inventors: James Fred Salzman, Anna, TX (US); Bradley David Sucher, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 37 days.

(21) Appl. No.: 15/238,445

(22) Filed: Aug. 16, 2016

(65) Prior Publication Data

US 2018/0053764 A1  Feb. 22, 2018

(51) Int. Cl.
*H01L 29/76* (2006.01)
*H01L 27/092* (2006.01)
*H01L 29/10* (2006.01)
*H01L 21/8238* (2006.01)

(52) U.S. Cl.
CPC .. *H01L 27/0921* (2013.01); *H01L 21/823892* (2013.01); *H01L 29/1083* (2013.01)

(58) Field of Classification Search
CPC ......... H01L 27/0921; H01L 21/823892; H01L 21/823807; H01L 29/1083
USPC .................................. 438/763, 607; 257/372
See application file for complete search history.

(56) References Cited

U.S. PATENT DOCUMENTS

| 9,281,232 B2 | 3/2016 | Salzman |
| 9,281,245 B2 | 3/2016 | Salzman et al. |
| 2003/0209781 A1 | 11/2003 | Hattori |
| 2008/0023824 A1 | 1/2008 | Salzman |
| 2008/0296675 A1* | 12/2008 | Yanagida ............ H01L 27/0694 257/334 |
| 2010/0075175 A1* | 3/2010 | Poblenz .................. C30B 7/105 428/697 |
| 2011/0095358 A1 | 4/2011 | Micciche' et al. |

(Continued)

FOREIGN PATENT DOCUMENTS

| CN | 105755535 A | 7/2016 |
| JP | 10229162 A | 8/1998 |

OTHER PUBLICATIONS

Chen, Dakai et al., "The Effects of ELDRS at Ultra-Lower Dose Rates", Conference: Radiation Effects Data Workshop (REDW), 2010 IEEE, DOI: 10.1109/REDW.2010.5619506, Source: IEEE Xplore.

(Continued)

*Primary Examiner* — Kevin M Picardat
(74) *Attorney, Agent, or Firm* — Kenneth Liu; Charles A. Brill; Frank D. Cimino

(57) ABSTRACT

Disclosed examples include semiconductor devices and fabrication methods to fabricate semiconductor wafers and integrated circuits, including forming a first epitaxial semiconductor layer of a first conductivity type on a first side of a semiconductor substrate of the first conductivity type, forming a nitride or oxide protection layer on a top side of the first epitaxial semiconductor layer, forming a second epitaxial semiconductor layer of the first conductivity type on the second side of the semiconductor substrate, and removing the protection layer from the first epitaxial semiconductor layer. The wafer can be used to fabricate an integrated circuit by forming a plurality of transistors at least partially on the first epitaxial semiconductor layer.

20 Claims, 5 Drawing Sheets

(56) References Cited

U.S. PATENT DOCUMENTS

| | | | |
|---|---|---|---|
| 2011/0287578 A1* | 11/2011 | Wojtczuk | H01L 31/0684 438/94 |
| 2013/0105904 A1 | 5/2013 | Roybal et al. | |
| 2013/0126508 A1 | 5/2013 | Salzman et al. | |
| 2013/0243021 A1* | 9/2013 | Siskavich | H01L 31/06875 372/43.01 |
| 2013/0264467 A1* | 10/2013 | Hong | H01L 27/14609 250/208.1 |
| 2014/0124895 A1 | 5/2014 | Salzman et al. | |
| 2014/0183707 A1 | 7/2014 | Salzman et al. | |
| 2016/0190237 A1 | 6/2016 | Salzman et al. | |

OTHER PUBLICATIONS

International Search Report for International Application No. PCT/US2017/047148.

* cited by examiner

PROCESS ENHANCEMENT USING DOUBLE SIDED EPITAXIAL ON SUBSTRATE

BACKGROUND

Radiation hardened and other high reliability electronic circuits are desired for a variety of applications in which systems and circuits are exposed to radiation, electromagnetic interference (EMI) or other adverse electrical noise conditions. Example applications include satellites and other spacecraft, aircraft, medical devices such as x-ray equipment, circuits used in nuclear power plants, processor cores and other sensitive digital circuits. In such applications, radiation can cause latchup in metal oxide semiconductor (MOS) circuits due to wells and doped regions that operate as bipolar transistors. During such a latchup condition, these parasitic bipolar transistors can be turned on by current flow beneath the MOS circuit components, leading to potentially large currents that interfere with operation of logic circuits in an integrated circuit (IC), and can sometimes cause the IC to become permanently damaged. Latchup typically involves inadvertent creation of a low-impedance path between the power supply rails of a MOSFET circuit, triggering a parasitic PNPN (silicon controlled rectifier or SCR) structure operating as a PNP and an NPN transistor stacked next to each other. During a latchup when one of the parasitic bipolar transistors is conducting, the other conducts and both keep each other in saturation as long as the structure remains forward-biased with some non-zero current flow. A single event latchup (SEL) is a latchup caused by a single event upset, typically from heavy ions or protons from cosmic rays or solar flares. Various integrated circuit applications require circuitry that operates in such radiation environments, and MOS circuit latchup can lead to processor circuits freezing up, requiring restarting or power cycling. Accordingly, improved semiconductor devices and fabrication techniques are desired for circuit applications involving radiation exposure to address digital circuit latchup problems.

SUMMARY

Disclosed examples include semiconductor devices and fabrication methods to fabricate semiconductor wafers and integrated circuits. One disclosed method includes forming a first epitaxial semiconductor layer of a first conductivity type on a first side of a semiconductor substrate of the first conductivity type, and forming a second epitaxial semiconductor layer of the first conductivity type on the second side of the semiconductor substrate. Disclosed semiconductor device examples include a semiconductor substrate of a first conductivity type, a first epitaxial semiconductor layer of the first conductivity type formed on the first side of the semiconductor substrate, and a second epitaxial semiconductor layer of the first conductivity type formed on the second side of the semiconductor substrate. The device can be used to fabricate an integrated circuit by forming a plurality of transistors at least partially on the first epitaxial semiconductor layer. In certain examples, a nitride or oxide protection layer is formed on a top side of the first epitaxial semiconductor layer prior to forming the second epitaxial layer, and the protection layer is removed after the second epitaxial layer is formed. In certain examples, the first and second epitaxial semiconductor layers are more lightly doped than the semiconductor substrate.

DETAILED DESCRIPTION

Figure 1:
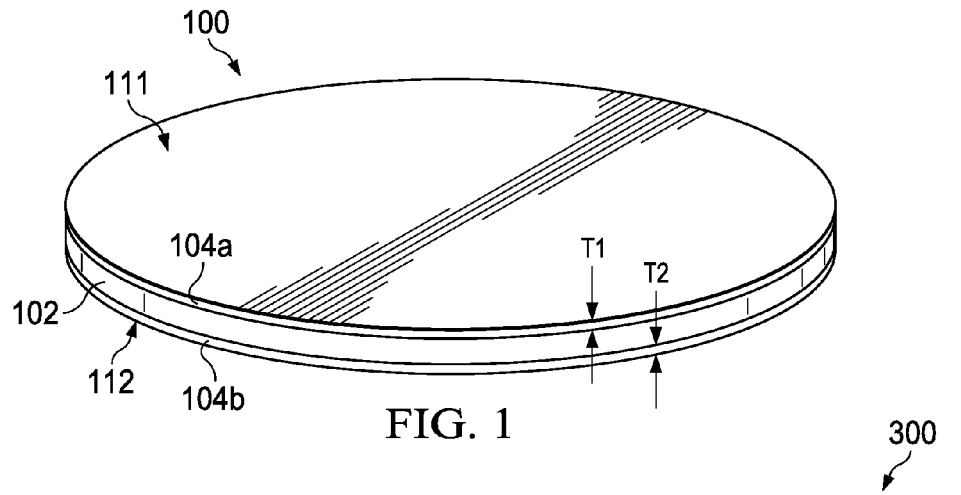
FIG. 1 is a perspective view of a semiconductor wafer device with first and second lightly doped p-type epitaxial layers on opposite top and bottom sides of a more heavily doped p-type substrate.
Figure 3:
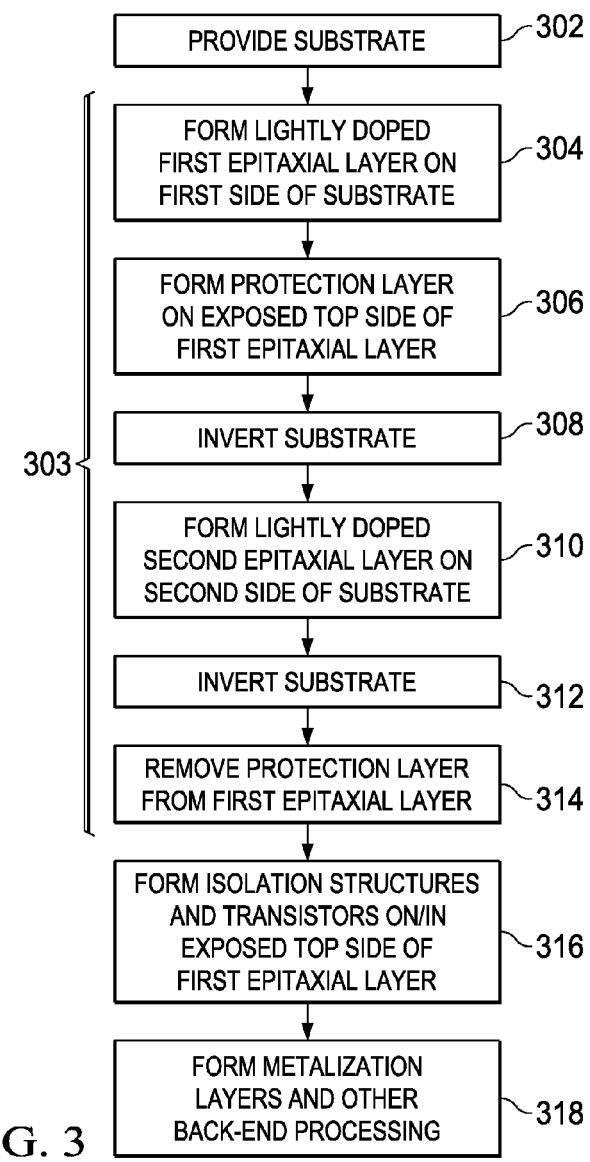
FIG. 3 is a flow diagram of a method to fabricate a semiconductor wafer and to fabricate an integrated circuit.

In the drawings, like the reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . "

FIG. 1 shows a semiconductor wafer or device 100 including first and second lightly doped p-type epitaxial semiconductor material layers 104*a* and 104*b*, respectively formed on opposite top and bottom sides of a more heavily doped p-type semiconductor substrate 102. In one example, the substrate 102 is bulk silicon material having a thickness suitable for semiconductor fabrication processing to create integrated circuit products, and the epitaxial layers 104 are epitaxial silicon material. In other examples, different semiconductor materials can be used for the substrate 102 and the epitaxial layers 104, and the concepts of the present disclosure are not limited to silicon. In one example, the thickness of the substrate 102 is in the range of 500-800 µm. The device 100 in one example is generally cylindrical having a diameter suitable for semiconductor fabrication processes, such as 150 mm, 200 mm, 300 mm, 450 mm diameter, etc. The first epitaxial layer 104*a* includes an exposed top side 111 and has a thickness T1. In one example, the thickness T1 is 3.0 µm or more. In certain examples, the thickness T1 is from 3.0 to 20 µm. In other examples, thicknesses T1 of greater than 20 µm can be used. The thickness T1 in certain examples is set by CMOS processing requirements of a given circuit application for transistors and other circuitry to be formed on or in the first epitaxial layer 104*a*. In practice, the epitaxial layer thickness T1 is selected so as to accommodate the CMOS transistor threshold voltage (VT) and other parametrics for a given integrated circuit design. The second epitaxial layer 104*b* has a thickness T2, and includes an exposed bottom side 112. In one example, the second epitaxial layer thickness T2 can be approximately equal to T1. The thickness T2, however, need not be determined based on CMOS processing requirements. In one example, the thickness T2 of the second epitaxial layer 104*b* is 2.0 to 20 µm. In certain examples, T2 is set to a suitable value to mitigate auto doping during thermal processing of the device 100 during fabrication of an integrated circuit, including epitaxial material consumption during oxidation process steps during fabrication.

The device 100 in FIG. 1 is particularly suitable for use as a starting wafer in the manufacture of high reliability and/or radiation hardened integrated circuit devices. In this regard, transient currents introduced by electrostatic discharge (ESD), voltage transients, light and ionizing radiation can trigger parasitic bipolar transistors and silicon controlled rectifiers (SCRs) in CMOS integrated circuits formed in bulk silicon wafers. This leads to latchup and other problems such as bipolar transistor gain degradation. Latchup in certain cases involves forward biasing of a P+/nwell junction with sufficient parasitic bipolar transistor gain, causing a latched state of a parasitic SCR, and leading to potentially large current flow between voltage supply and reference voltage nodes. These latchup issues are more pronounced as feature sizes continue to shrink (e.g., 90 nm to 28 nm, etc.). CMOS latchup mechanisms can be mitigated to a certain extent by formation of a relatively high resistivity epitaxial layer over a lower resistivity starting substrate. The transistors and other components are formed in the more lightly doped, higher sheet resistivity P− epitaxial layer, and thus parasitic bipolar and SCR devices have much lower gain and are less likely to cause latchup. In one example, P+/P− epitaxial substrates are used to fabricate integrated circuits to mitigate sensitivity to latchup caused by cosmic rays (e.g., terrestrial neutron and proton reactions) in avionic applications and/or sensitivity to heavy ions in space applications.

The use of P+/P− wafers, however, leads to problems of auto doping during thermal processing. In particular boron or other p-type dopants can migrate from the heavily doped P+ silicon to the lightly doped P− epitaxial layers of adjacent wafers during furnace annealing, laser anneal, rapid thermal processing (RTP) or other thermal processing steps of an integrated circuit fabrication process. In order to control auto doping, P+/P− wafers often include a backside capping layer, such as a low-temperature oxidation (LTO) nitride layer, used to mitigate auto doping. However, P+/P− starting wafers are subject to warping caused by thermal stress at the interface between the highly and lightly doped layers. This warping problem is more pronounced for larger wafer sizes, and the presence of an auto doping protection layer can exacerbate warping. In addition, charge can accumulate at the LTO capping layer during fabrication processing using plasma tools and implant tools.

The use of first and second epitaxial layers 104 on opposite sides of the starting substrate 102 in the device 100 of FIG. 1 facilitates fabrication and construction of high reliability and/or radiation hardened integrated circuit devices, while mitigating or avoiding both auto doping and warping. In addition, the device 100 also facilitates fabrication using standard processing tools without arcing problems previously caused by the presence of LTO nitride auto doping cap layers. The starting substrate 102 in one example is bulk silicon with a relatively low sheet resistivity, and the epitaxial layers 104a have a relatively higher sheet resistivity. In practice, the sheet resistivity of the device 100 generally varies according to a profile between the top and bottom sides 111 and 112. For example, the sheet resistivity of the epitaxial layers 104a and 104b at the top and bottom sides 111 and 112 in one example is approximately 8-12 ohm-cm, the sheet resistivity near the interfaces between the first and second sides of the substrate 102 and the corresponding epitaxial layers 104 is approximately 1 ohm-cm, and the sheet resistivity near the middle of the substrate 102 is on the order of 0.025 ohm-cm. As previously discussed, the thickness T1 of the first epitaxial layer 104a can be tailored to accommodate the threshold voltage and other performance parameters of transistors and other components formed on or in the first epitaxial layer 104a. The second epitaxial layer 104b operates as a barrier to outward migration of boron or other dopants from the heavily doped substrate 102 during thermal processing, thereby mitigating auto doping during integrated circuit fabrication. Moreover, the second epitaxial layer 104b counteracts in-process warping by providing a second interface to the substrate 102 on the opposite side of the first epitaxial layer 104a.

Figure 2:
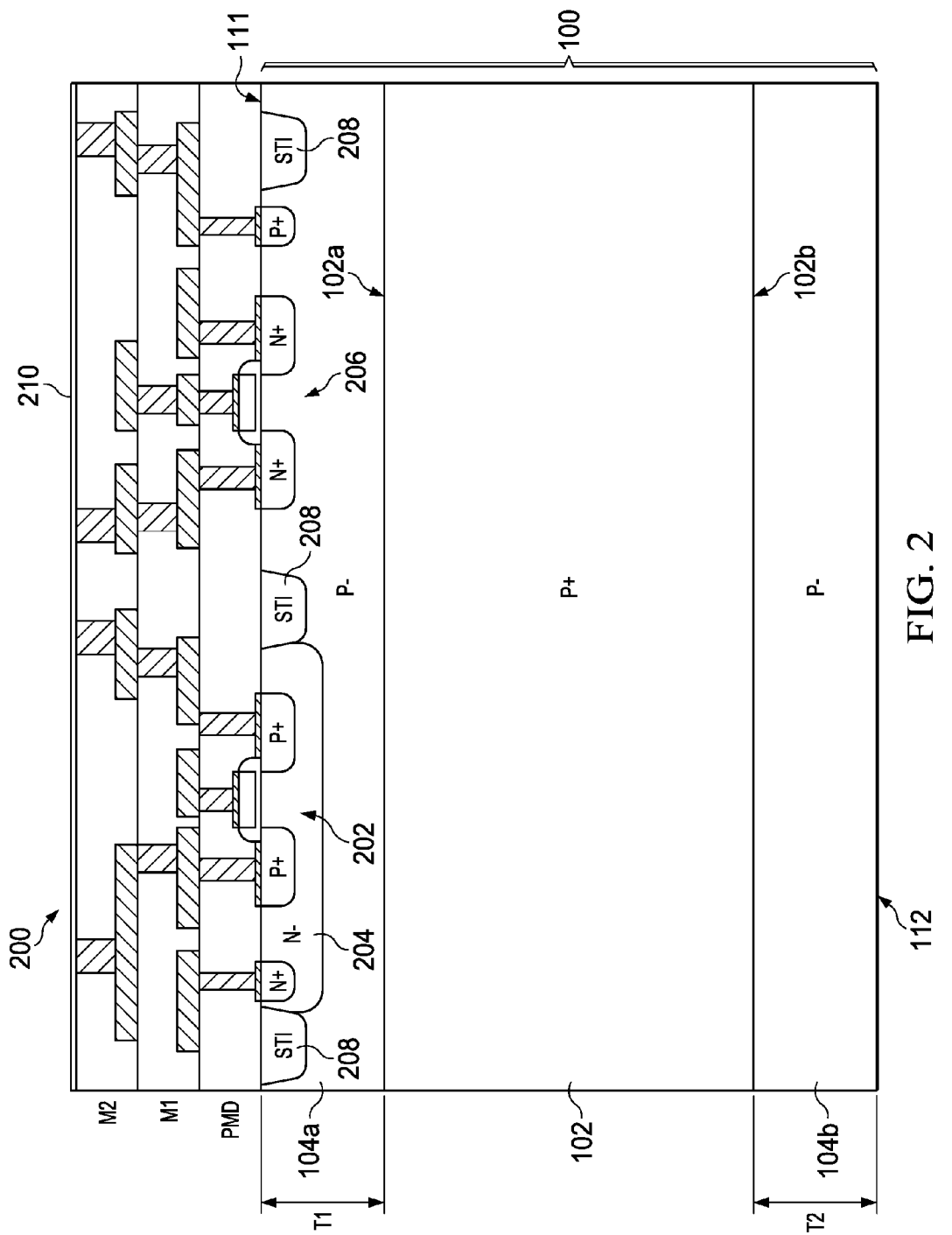
FIG. 2 is a partial sectional side elevation view of an integrated circuit fabricated using the semiconductor wafer of FIG. 1.

Referring also to FIG. 2, an integrated circuit (IC) 200 is shown, which is built using the device 100 of FIG. 1. The IC 200 includes a semiconductor substrate 102 of a first conductivity type (e.g., p-type) which has a planar first (e.g., upper) side 102a and a planar opposite second (e.g., bottom) side 102b. The first epitaxial semiconductor layer 104a, also p-type in this example, is formed on the first side 102a of the substrate 102, and the p-type second epitaxial semiconductor layer 104b is formed on the second side 102b of the substrate 102. The IC 200 also includes one or more transistors 202 and 206 formed at least partially on the first epitaxial semiconductor layer 104a. Many such transistors and other electronic components (not shown) can be formed at least partially on the epitaxial layer 104a using standard fabrication techniques. In FIG. 2, a PMOS transistor 202 is formed in a lightly doped (e.g., N−) n-well 204. Relatively heavily doped P+ source/drain regions are formed in the n-well 204 on opposite sides of a channel region, with a gate structure formed at least partially over the PMOS channel region. In this example, an N+ well contact is included, and the PMOS transistor 202 is isolated from other peripheral components by one or more isolation structures 208 (shallow trench isolation or STI structures in this example). The second transistor 206 in FIG. 2 is an NMOS transistor including N+ source/drains formed in the lightly doped P− epitaxial layer material 104a and a gate structure formed over the P− channel region between the N+ source/drains. A P+ substrate contact is also formed adjacent the NMOS transistor 206 in this example to provide electrical conductivity to the P+ substrate 102.

As the transistor source/drain regions are formed in the top side 111 of the first epitaxial layer 104a, with the gate structures and source/drain contacts formed above the top side 111, the transistors 202, 206 are at least partially formed on the first epitaxial semiconductor layer 104a. The IC 200 in FIG. 2 also includes a pre-metal dielectric (PMD) structure layer formed over the top side 111. The PMD layer includes one or more conductive contact structures forming electrical contacts to the source/drain regions, the gates and the well/substrate contacts. The IC 200 further includes one or more metallization layers M1 and M2 and an upper passivation layer 210. Each of the metallization layers M1, M2 includes interlayer dielectric (ILD) material and conductive contact structures to interconnect various components and component terminals of an electrical circuit formed by the transistors 202, 206 and other electrical components of the IC 200. The use of the lightly doped P− epitaxial layer 104a advantageously mitigates radiation-induced latchup of the transistors 202, 206 and other problems related to exposure to radiation. In addition, the second or lower epitaxial layer 104b advantageously provides a barrier to mitigate or prevent auto doping during fabrication, and also counteracts any warping effects associated with the presence of the upper first epitaxial layer 104a. Furthermore, the second epitaxial layer 104b does not suffer from charge accumulation during plasma or implantation processing steps, and thus is not subject to arcing problems previously associated with auto doping prevention (e.g. nitride) layers.

Referring now to FIGS. 3-7, FIG. 3 shows a method 300 to fabricate a semiconductor device, including process steps 303 to form a starting wafer or device 100 as shown in FIG. 1, as well as further processing steps to form an integrated circuit such as the IC 200 of FIG. 2. FIGS. 4-7 show the semiconductor wafer device 100 of FIG. 1 at various stages of fabrication according to the methods 300 and 303 of FIG. 3. The methods 300, 303 can be used in association with P−/P+/P− devices 100 is shown in FIGS. 1 and 2, as well as with N−/N+/N− devices as illustrated and described below in connection with FIGS. 8 and 9. The method 300 begins at 302 with a starting wafer or substrate 102. Any suitable semiconductor substrate 102 can be used in the method 300. The starting substrate in one example is a sawed and double-sided polished silicon wafer of a first conductivity type (e.g., p-type in one example). The starting substrate 102 can have any suitable dimensions (e.g., a cylindrical wafer with 150 mm, 200 mm, 300 mm or 450 mm diameter, 500-800 µm thickness).

Figure 4:
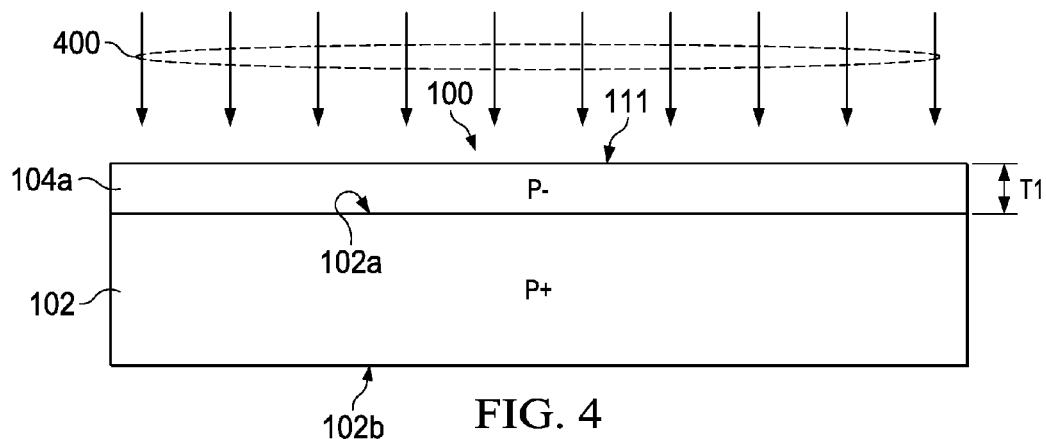
FIGS. 4-7 are partial sectional side elevation views of the semiconductor wafer of FIG. 1 at various stages of fabrication according to the method of FIG. 3.
Figure 5:
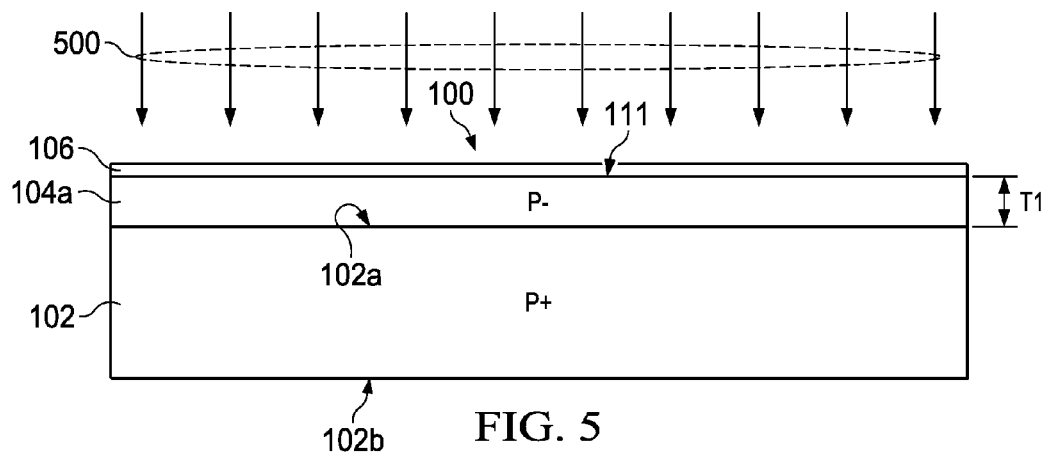

The method 300 includes fabrication of a device (e.g., device 100 above) at 303, including forming a first epitaxial silicon layer 104a at 304 of the first conductivity type on a first side of the substrate (e.g., first side 102a in FIG. 2 above). FIG. 4 shows an example of the processing at 304, in which an epitaxial growth process step 400 is used to form the p-type first epitaxial layer 104a to a first thickness T1 on the first side 102a of the P+ substrate 102. Any suitable epitaxial growth process 400 can be used at 304 to provide lightly doped p-type silicon material having a crystalline structure that generally mimics the crystalline orientation of the first side 102a of the substrate 102.

In certain examples, an optional protection layer is formed at 306 on the exposed top side 111 of the first epitaxial layer 104a. In one implementation, an oxidation process 500 is used in FIG. 5 to form an oxide and/or nitride protection layer 106 to a thickness of approximately 400 Å or more, such as 400-2000 Å on the top side 111 of the first epitaxial semiconductor layer 104a. The substrate is flipped or inverted at 308, leaving the exposed second side 102a of the substrate 102 on top of the structure. In practice, the protection layer 106 provides protection for the top side 111 of the first epitaxial layer 104a during subsequent fabrication processing, with the first epitaxial layer 104a being designed for subsequent formation of transistors and other electronic components in the finished IC device 200 of FIG. 2. In one example, a nitride material is formed at 306 on the top side 111 of the first epitaxial silicon layer 104a before forming 310 the second epitaxial silicon layer 104b. In another example, an oxide material is formed at 306 on the top side 111 of the first epitaxial silicon layer 104a before forming 310 the second epitaxial silicon layer 104b.

Figure 6:
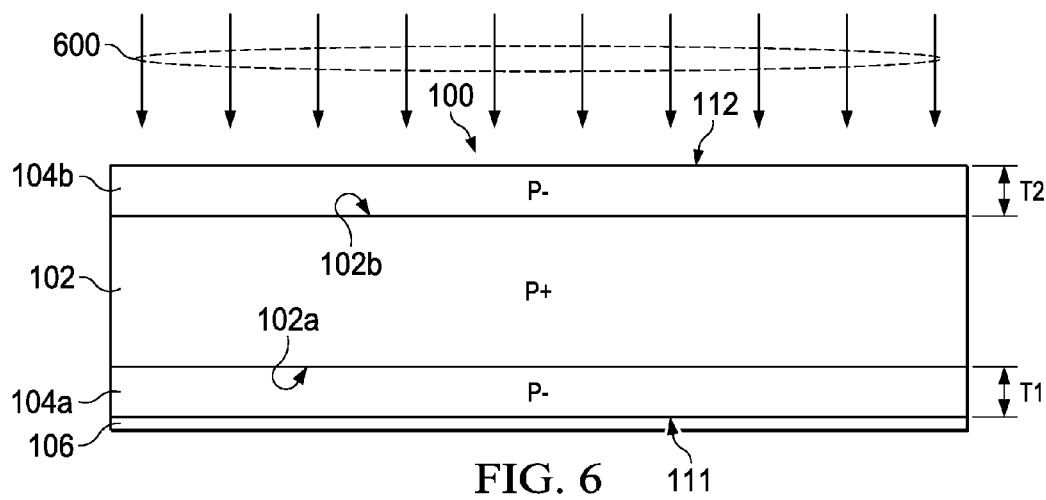

The method 303 further includes forming a second lightly doped p-type epitaxial silicon layer 104b at 310 on the second side 102b of the silicon substrate 102. As shown in FIG. 6, a second epitaxial growth process 600 is performed to form the second epitaxial layer 104b to a thickness T2 on the second side 102b of the substrate 102. This leaves a structure as shown in FIG. 6 with the protection layer 106 formed over the top side 111 of the first epitaxial layer 104a. The second epitaxial layer thickness T2 can be the same or similar as the thickness T1 of the first epitaxial layer 104a, although not a strict requirement of all implementations of the methods 300, 303. Moreover, any suitable second epitaxial growth process 600 can be used at 310 to form the second lightly doped epitaxial layer 104b.

Figure 7:
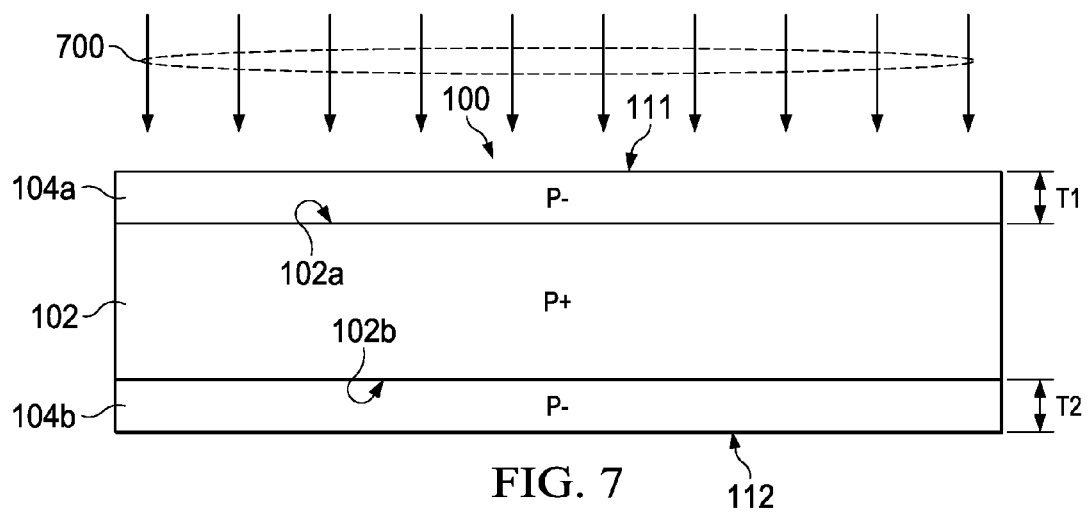

At 312, the structure is again flipped or inverted, and any previously formed protection layer 106 is removed at 314. FIG. 7 illustrates an example etch or material removal process 700 used to remove the protection layer 106, leaving the top side 111 of the first epitaxial layer 104a exposed. The processing at 303 in FIG. 3 yields a device 100 is shown in FIG. 1 where p-type semiconductor materials 102, 104 are used. In another example, the processing steps 303 in FIG. 3 can be used to fabricate a device 802 as shown in FIG. 8, including an N+ substrate 802 and first and second lightly doped N− epitaxial layers 804a and 804b.

The IC fabrication method 300 in one example further includes forming a plurality of transistors 202, 206 at least partially on the first epitaxial silicon layer 104a at 316 after removing the protection layer 106 from the first epitaxial silicon layer 104a. One or more metallization layers and other back-and processing is performed at 318 in FIG. 3 in order to provide an integrated circuit device, such as the IC 200 of FIG. 2 above.

Figure 8:
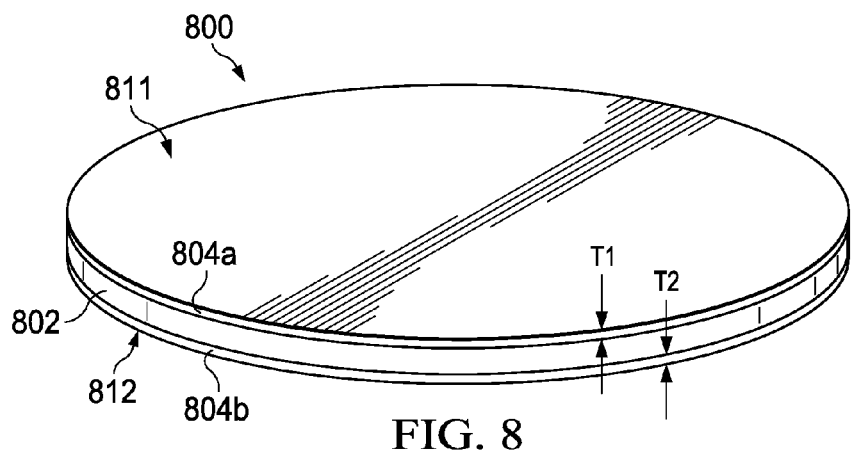
FIG. 8 is a perspective view of a semiconductor wafer with first and second lightly doped n-type epitaxial layers on opposite top and bottom sides of a more heavily doped n-type substrate.
Figure 9:
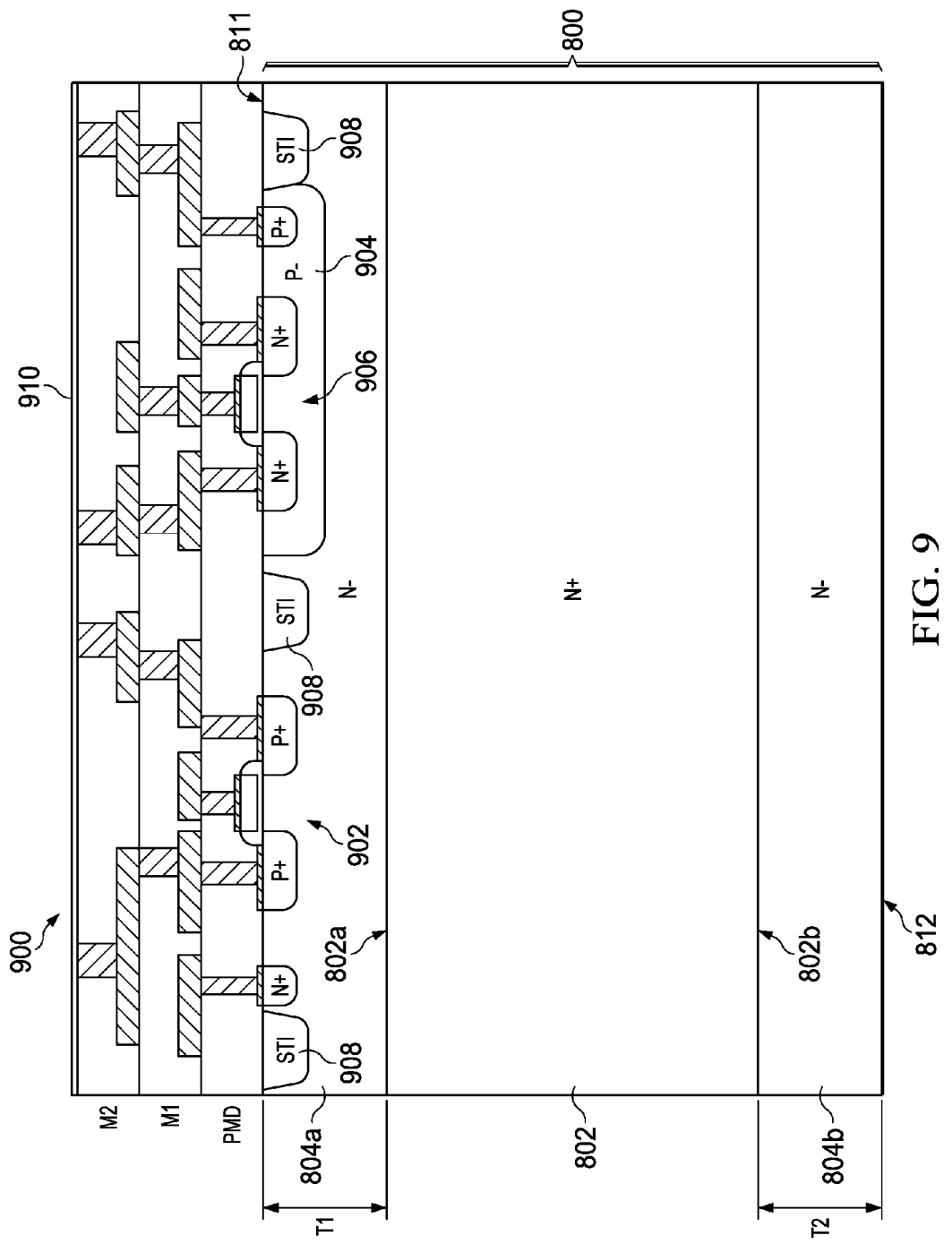
FIG. 9 is a partial sectional side elevation view of an integrated circuit fabricated using the semiconductor wafer of FIG. 8.

Referring also to FIGS. 8 and 9, FIG. 8 shows an N−/N+/N− wafer or device 800, including an N+ substrate 802, a first lightly doped N-epitaxial layer 804a formed on a first side of the substrate 802, and a second lightly doped N− epitaxial layer 804b formed on an opposite second side of the substrate 802. The device 800 and the IC 900 in FIGS. 8 and 9 can be fabricated using the processes 300 and 303 of FIG. 3 with p-type dopants and materials being replaced with n-type dopants and materials, and vice versa. As discussed above in connection with the P−/P+/P− device 100 of FIG. 1, the device 800 can be used as a starting wafer for fabricating a high reliability and/or radiation hardened IC, in which the first and second epitaxial layers 804 provide counterbalancing with respect to warping during processing, as well as mitigating auto doping during processing. Moreover, the first epitaxial layer 804a can be used for fabricating transistors and other electronic components in a relatively lightly doped semiconductor material to mitigate latchup and other radiation-based effects on the resulting IC. The processing steps 303 in FIG. 3 can be used to fabricate the device 800 of FIG. 8, where the materials used in the substrate 802 and the epitaxial layers 804 are n-type doped (e.g., using phosphorus or other suitable n-dopants).

FIG. 9 shows an example IC 900 fabricated using the device 800 of FIG. 8, including the substrate 802, the first epitaxial layer 804a formed on a first side 802a of the substrate 802, and the second epitaxial layer 804b on the opposite second side 802b of the substrate 802. In this example, a PMOS transistor 902 is formed on the top side 811 of the first epitaxial semiconductor layer 804a, including P+ source/drains formed in the lightly doped N− epitaxial layer 804a. This example also includes an N+ substrate contact formed with the PMOS transistor 902 between a pair of STI structures 908. The IC 900 also includes a lightly doped P− p-well 904 in which an NMOS transistor 906 and a P+ well contact are formed in the first epitaxial layer 804a. The transistors 902 and 906 also include gate structures overlying the corresponding channel regions, and a PMD structure layer, as well as one or more metallization layers M1 and M2, and an upper passivation layer 910.

This is what our technique does, it eliminates SEL from injected energy sources, like charged particles, neutrons, ESD strikes, and photon (light) injection. Most processing equipment requires a protective backside coating on the highly doped P+ substrate. This prevents the P+ boron from out-diffusing from the backside of the P+ wafer and mitigates contamination to the equipment or the wafer just behind the P+ substrate (combats auto-doping). Solutions that use a single epitaxial layer on a P+ substrate need a protective backside layer(s) and these layers are always non-conductive which can cause the wafer to charge up during wafer processing causing arching. The disclosed examples provide a blocking layer by formation of the doped second epitaxial layer 104*b*, 804*b*. The doped second epitaxial layer blocks boron out-diffusion in P−/P+/P− examples to mitigate auto-doping. The second epitaxial layer 104*b* 804*b* also provides a backside conductivity of the substrate to chucking equipment during fabrication, and can thus be used in regular fabrication equipment without additional modification or additional blocking layers.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A device, comprising:
   a semiconductor substrate of a first conductivity type, the semiconductor substrate including a planar first side and a planar second side;
   a first semiconductor layer of the first conductivity type located on the first side of the semiconductor substrate; and
   a second semiconductor layer of the first conductivity type located on the second side of the semiconductor substrate;
   wherein regions of a second conductivity type are formed in only one of the first semiconductor layer and the second semiconductor layer, and wherein none of the regions of the second conductivity type are electrically connected through the semiconductor substrate and the other one of the first semiconductor layer and the second semiconductor layer.

2. The device of claim 1, wherein the first and second semiconductor layers are more lightly doped than the semiconductor substrate.

3. The device of claim 2, wherein the first conductivity type is p-type and the second conductivity type is n-type.

4. The device of claim 2, wherein the first conductivity type is n-type and the second conductivity type is p-type.

5. The device of claim 1, wherein at least a first region and a second region of the regions of the second conductivity type form a source and a drain, respectively, of a transistor.

6. An integrated circuit (IC) device, comprising:
   a semiconductor substrate of a first conductivity type, the semiconductor substrate including a planar first side and a planar second side;
   a first epitaxial semiconductor layer of the first conductivity type formed on the first side of the semiconductor substrate;
   a second epitaxial semiconductor layer of the first conductivity type formed on the second side of the semiconductor substrate; and
   a plurality of transistors formed at least partially at a surface of the first epitaxial semiconductor layer;
   wherein no transistors are formed at a surface of the second epitaxial semiconductor layer, and wherein none of the transistors of the first epitaxial semiconductor layer are electrically connected through the semiconductor substrate and the second epitaxial semiconductor layer.

7. The IC device of claim 6, wherein the first and second epitaxial semiconductor layers are more lightly doped than the semiconductor substrate.

8. The IC device of claim 7, wherein the first conductivity type is p-type.

9. The IC device of claim 7, wherein the first conductivity type is n-type.

10. A method to fabricate a semiconductor device, the method comprising:
    forming a first epitaxial semiconductor layer of a first conductivity type on a first side of a semiconductor substrate of the first conductivity type;
    forming a second epitaxial semiconductor layer of the first conductivity type on the second side of the semiconductor substrate; and
    forming regions of a second conductivity type at least partially in the first epitaxial semiconductor layer, wherein no regions of the second conductivity type are formed in the second epitaxial semiconductor layer, and wherein the semiconductor substrate has no conductive paths extending therethrough from the first epitaxial semiconductor layer to the second epitaxial semiconductor layer.

11. The method of claim 10, further comprising:
    forming a protection layer on a top side of the first epitaxial semiconductor layer before forming the second epitaxial semiconductor layer; and
    removing the protection layer from the first epitaxial semiconductor layer after forming the second epitaxial semiconductor layer.

12. The method of claim 11, wherein forming the protection layer includes forming a nitride material on the top side of the first epitaxial semiconductor layer before forming the second epitaxial semiconductor layer, or forming an oxide material on the top side of the first epitaxial semiconductor layer before forming the second epitaxial semiconductor layer.

13. The method of claim 12, wherein the first and second epitaxial semiconductor layers are more lightly doped than the semiconductor substrate.

14. The method of claim 11, wherein forming the regions of the second conductivity type at least partially in the first epitaxial semiconductor layer is performed after removing the protection layer from the first epitaxial semiconductor layer.

15. The method of claim 14, wherein the first and second epitaxial semiconductor layers are more lightly doped than the semiconductor substrate.

16. The method of claim 10, wherein the first and second epitaxial semiconductor layers are more lightly doped than the semiconductor substrate.

17. The method of claim 16, wherein the first conductivity type is p-type and the second conductivity type is n-type.

18. The method of claim 16, wherein the first conductivity type is n-type and the second conductivity type is p-type.

19. The method of claim 16, further comprising:
    forming a nitride or oxide protection layer on a top side of the first epitaxial semiconductor layer before forming the second epitaxial semiconductor layer; and
    removing the protection layer from the first epitaxial semiconductor layer after forming the second epitaxial semiconductor layer.

20. The method of claim 10, comprising forming isolation structures in the first epitaxial semiconductor layer but not in the second epitaxial semiconductor layer.

* * * * *